United States Patent [19]

Eilbeck

[11] Patent Number: 4,650,745

[45] Date of Patent: Mar. 17, 1987

[54] METHOD OF FORMING A RESIST PATTERN BY RADIATION EXPOSURE OF POSITIVE-WORKING RESIST COATING COMPRISING A DYE AND A TRIHYDROXYBENZOPHENONE COMPOUND AND SUBSEQUENT AQUEOUS ALKALINE DEVELOPMENT

[75] Inventor: James N. Eilbeck, Ringwood, N.J.

[73] Assignee: Philip A. Hunt Chemical Corporation, Palisades Park, N.J.

[21] Appl. No.: 878,736

[22] Filed: Jun. 26, 1986

Related U.S. Application Data

[62] Division of Ser. No. 741,070, Jun. 4, 1985.

[51] Int. Cl.$^4$ .................................................. G03F 7/26
[52] U.S. Cl. ..................................... 430/326; 430/330
[58] Field of Search .......................... 430/326, 309, 191

[56] References Cited

U.S. PATENT DOCUMENTS

| | | | |
|---|---|---|---|
| 3,661,582 | 5/1972 | Broyde | 96/36.91 D |
| 4,009,033 | 2/1977 | Bakos et al. | 96/33 |
| 4,036,644 | 7/1977 | Kaplan et al. | 96/36 |
| 4,115,128 | 9/1978 | Kita | 96/91 D |
| 4,271,251 | 6/1981 | Aotani et al. | 430/195 |
| 4,275,139 | 6/1981 | Stahlhofen | 430/192 |
| 4,299,906 | 11/1981 | Liu | 430/157 |
| 4,307,173 | 12/1981 | Gventer | 430/165 |
| 4,356,255 | 10/1982 | Tachikawa et al. | 430/325 |
| 4,362,809 | 12/1982 | Chen et al. | 430/312 |
| 4,365,019 | 12/1982 | Daly et al. | 430/190 |
| 4,370,405 | 1/1983 | O'Toole et al. | 430/312 |
| 4,377,631 | 3/1983 | Toukhy et al. | 430/192 |
| 4,387,152 | 6/1983 | Stahlhofen | 430/191 |
| 4,414,314 | 11/1983 | Kaplan et al. | 430/311 |
| 4,544,627 | 10/1985 | Takahashi et al. | 430/325 |
| 4,594,306 | 6/1986 | Stohlhofer et al. | 430/191 |

FOREIGN PATENT DOCUMENTS

| | | |
|---|---|---|
| 1561438 | 2/1980 | United Kingdom . |
| 332413 | 4/1972 | U.S.S.R. . |

*Primary Examiner*—Charles L. Bowers, Jr.
*Attorney, Agent, or Firm*—William A. Simons; Thomas P. O'Day

[57] ABSTRACT

Disclosed is a positive-working resist composition which demonstrates improved photospeed and rate of development. The resist composition contains a solvent and select proportions of a novolak resin, a naphthoquinone diazide sensitizer, a dye which absorbs light at a maximum wavelength of from about 330 to about 460 nm and an effective proportion of a trihydroxybenzophenone compound. Also disclosed is a method of forming a resist pattern on a substrate by employing the positive-working resist composition.

6 Claims, No Drawings

METHOD OF FORMING A RESIST PATTERN BY RADIATION EXPOSURE OF POSITIVE-WORKING RESIST COATING COMPRISING A DYE AND A TRIHYDROXYBENZOPHENONE COMPOUND AND SUBSEQUENT AQUEOUS ALKALINE DEVELOPMENT

This is a division of application Ser. No. 741,070 filed June 4, 1985.

This invention relates to a positive-working resist composition, and more particularly, to a positive-working resist composition containing a dye and a trihydroxybenzophenone compound. The invention further relates to a patterning method in which the noted positive-working resist composition is employed and which provides improved photospeed and rate of development.

In the fabrication of semiconductors and electronic circuits, a resist composition is typically coated onto a substrate, such as a silicon wafer, as a thin film, which is then exposed with activating radiation to define a desired pattern. If the resist composition is positive-working, the exposed areas of the resist layer are rendered soluble by the exposure, and they are removed by washing with a developer to uncover the underlying substrate. The areas surrounding the uncovered substrate, which were not exposed remain and protect the portions of the substrate which they overlie. An etchant to which the resist is impervious may then be used to etch away the uncovered areas, or selective plating or other processes may be accomplished, and there remains a layer of resist in the desired image pattern. Later in the manufacturing process, the remaining resist pattern may or may not be removed, as desired.

Examples of positive-working resist compositions include those containing phenol-formaldehyde (novolak) resins and naphthoquinone diazide sensitizers. See, for example, U.S. Pat. No. 4,377,631. It is also known to incorporate a dye additive into a positive-working resist composition in order to visibly distinguish the exposed portions from the unexposed portions after imagewise exposure. See, for example, U.S. Pat. No. 4,271,251. However, the inclusion of a dye additive also tends to reduce the light sensitivity of the resist layer.

In order to increase light sensitivity, a number of additives have been included in positive-working resist compositions containing a novolak resin and a naphthoquinone diazide sensitizer. For example, in U.S. Pat. No. 4,036,644, an aliphatic carboxylic acid is added to the resist composition to increase its speed and adhesion to substrate surfaces. Other additives which are used to increase the speed of the resist composition include organic acid cyclic anhydrides (U.S. Pat. No. 4,115,128) and certain polyhalogenated heterocyclic compounds (U.S. Pat. No. 4,365,019). None of these patents discloses the incorporation of a trihydroxybenzophenone compound into a positive-working resist composition to increase its photospeed and rate of development.

In British Pat. No. 1,561,438, coatings for printing plate applications are disclosed, there being incorporated into the coatings certain hydroxyl group-containing organic compounds which are capable of forming chelate compounds. These organic compounds may include polyhydroxybenzophenones, but in relatively small proportions, and they are added to increase adhesion of the coating to a metal substrate. There is no intimation that any of the additives may serve to increase the photospeed of the coating composition.

It is against this background that the present invention introduces a novel positive-working resist composition which contains a dye and a select trihydroxybenzophenone compound to increase photospeed and rate of development. The resist composition is very select and it comprises a solvent and, by weight, based on the total solids in the composition: from about 63 to about 68 percent of a novolak resin; from about 15 to about 22 percent of a naphthoquinone diazide sensitizer; from about 0.1 to about 3 percent of a dye which absorbs light at a maximum wavelength of from about 330 to about 460 nm; and an effective proportion of an additive compound, the additive compound being a trihydroxybenzophenone compound and the proportion ranging from about 10 to about 20 percent.

In the practice of the invention, the positive-working resist composition provides increased photospeed and rate of development, while showing acceptable performance in regard to such properties as contrast, resolution and retention of unexposed resist layer thickness.

The resist composition of the present invention comprises a solution of a novolak resin, a naphthoquinone diazide sensitizer, a dye and a select additive compound in a compatible solvent. The solids content of the resist composition is preferably between about 20 and about 40 percent, more preferably between about 30 and about 40 percent.

In accordance with the present invention, any suitable novolak resin may be used in the resist composition. Preferably, the novolak resin is a cresol-formaldehyde novolak resin and is produced by condensing a mixture of cresol isomers with formaldehyde in the presence of acid. Preferably, the mixture includes from about 45 to about 60 percent of meta-cresol and from about 55 to about 40 percent of para-cresol, by weight. A particularly preferred method of prepating the cresol-formaldehyde novolak resin employed in the resist composition of the present invention is disclosed in U.S. Pat. No. 4,377,631, the entire disclosure of which is incorporated herein by reference.

The novolak resin is present in the resist composition in an amount ranging from about 63 to about 68 percent, and preferably ranging from about 65 to about 68 percent, by weight, based on the total solids in the resist composition.

Preferably, the naphthoquinone diazide sensitizer used in producing the resist composition of the present invention is an ester of 1,2-naphthoquinone-2-diazide-5-sulfonyl halide, preferably chloride, and a low molecular weight phenol compound, preferably having at least two benzene nuclei in the molecule and containing at least two phenolic hydroxyl groups. In a more preferred embodiment, the naphthoquinone diazide sensitizer is prepared by mono-, di- or tri-esterifying a low molecular weight phenol compound with 1,2-naphthoquinone-2-diazide-5-sulfonyl chloride, the phenol compound being exemplified by the following formula:

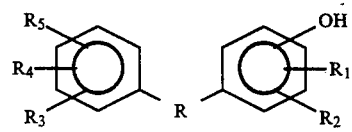

wherein:

R is a single bond or one of the groups CO, S, O, SO$_2$ or CR$_6$R$_7$, preferably CO or CR$_6$R$_7$;

R$_1$, R$_2$, R$_3$, R$_4$ and R$_5$ are each independently H, X (where X is a halogen atom), OH, a lower alkyl group having 1 to 4 carbon atoms or a lower alkoxy group having 1 to 4 carbon atoms; and R$_6$ and R$_7$ are each independently H or a lower alkyl group having 1 to 4 carbon atoms, preferably H or CH$_3$;

or wherein:

two of the radicals R$_3$, R$_4$ and R$_5$ or the two radicals R$_1$ and R$_2$ independently jointly form an aromatic ring, whereby at least one of the radicals R$_1$, R$_2$, R$_3$, R$_4$ or R$_5$ is OH.

Illustrative low molecular weight phenol compounds which may be reacted with 1,2-naphthoquinone-2-diazide-5-sulfonyl halide include the following: 2,4-dihydroxybenzophenone; 2,3,4-trihydroxybenzophenone; 2,4,2',4'-tetrahydroxy diphenyl sulfide; 2,2'-dihydroxy dinaphthyl methane; 4,4'-dihydroxy-2,2'-dimethyl-5,5'-di-tert.-butyl diphenyl sulfide; 4,4'-dihydroxy diphenyl sulfide; 4,6-bis-(2,4-dihydroxy phenylthio)-resorcinol; 2,4,2',4'-tetrahydroxy-3,5,3',5'-tetra-bromodiphenyl sulfone; 2,4,2',4'-tetrahydroxy-3,5,3',5'-tetrabromobiphenyl and 2,4-dihydroxy-3,5-dibromobenzophenone.

In another preferred embodiment of the present invention, the naphthoquinone diazide sensitizer is a sulfonamide of 1,2-naphthoquinone-2-diazide-5-sulfonyl halide, preferably chloride, and a compound having the following formula:

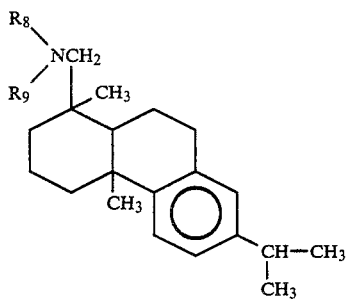

wherein: R$_8$ is R$_{10}$ or R$_{11}$, but cannot be both R$_{10}$ and R$_{11}$ in the same molecule, wherein R$_{10}$ is 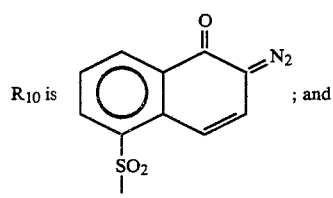 ; and R$_{11}$ is 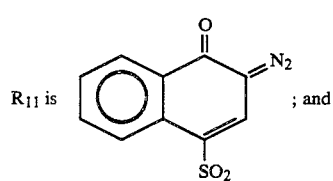 ; and R$_9$ is H, C$_2$H$_5$ or C$_2$H$_4$OH.

In accordance with a particularly preferred embodiment, the naphthoquinone diazide sensitizer is the esterification product of 1 mole of 2,3,4-trihydroxybenzophenone and 2 moles of 1,2-naphthoquinone-2-diazide-5-sulfonyl halide.

The naphthoquinone diazide sensitizer is typically present in the photoresist composition in an amount ranging from about 15 to about 22 percent, preferably ranging from about 16 to about 21 percent, by weight, based on the total solids in the resist composition.

The photoresist composition of the present invention also includes a dye which absorbs light at a maximum wavelength from about 330 to about 460 nanometers (nm). Preferably, the dye has an absorption maximum ranging from about 400 to about 460, and more preferably from about 400 to about 440. The dye helps to provide increased resolution by inhibiting back scattering of light off the substrate. Also, depending upon the nature of the dye, after exposing the resist composition patternwise to actinic radiation, the dye may provide a clearly visible color contrast between exposed and unexposed areas.

Suitable dyes include, for example, anthraquinones, such as 1,8-dihydroxy anthraquinone, 1,5-dihydroxy anthraquinone and 1,4-dihydroxy anthraquinone; and coumarins, such as coumarin 6, coumarin 7, coumarin 30, coumarin 153, coumarin 334, coumarin 337, coumarin 338, coumarin 343, coumarin 355, and coumarin 504, all of which are commercially available from Kodak Laboratory and Specialty Chemicals, Eastman Kodak Company, Rochester, N.Y. and are described in Kodak Laboratory Chemicals, Catalog No. 51 (Jan. 1, 1981), the entire disclosure of which is incorporated herein by reference.

Additional suitable dyes include diphenylmethanes, triphenylmethanes, azines, e.g. phenazines and oxazines, and xanthenes, as well as azo dyes, such as phenylazo DEA (diethyl amino) compounds having the formula

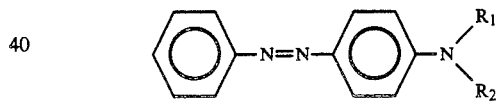

wherein: R$_1$ and R$_2$ are each independently an alkyl group having 1 to 12 carbon atoms and a cycloalkyl group having 5 to 12 carbon atoms.

The dye is present in the resist composition in an amount usually ranging from about 0.1 to about 3 percent, and preferably ranging from about 0.2 to about 1.5 percent by weight, based on the total solids in the resist composition.

In accordance with the invention, an improvement in the photospeed and rate of development of the resist composition is effected by adding an effective amount of an additive compound as described hereinabove. By employing the resist composition which includes the select additive compound according to the invention, there is a substantial increase in photospeed and rate of development, yet other important properties such as contrast, resolution and retention of unexposed resist layer thickness, are still within acceptable limits.

As previously noted, the select additive compound is a trihydroxybenzophenone compound. Suitable trihydroxybenzophenone compounds include 2,3,4-trihydroxybenzophenone, 2,4,6-trihydroxybenzophenone, and 2,4,4'-trihydroxybenzophenone. In a particularly preferred embodiment of the invention, 2,3,4-trihydroxybenzophenone is employed.

Generally, the additive compound will be included in the resist composition in an amount ranging from about 10 to about 20 percent, and preferably from about 10 to about 15 percent, by weight, based on the total solids in the resist composition.

The positive-working resist composition is formed by adding the novolak resin, the naphthoquinone diazide sensitizer, the dye, and the select additive compound to a solvent in which all of the components are readily soluble. The order of addition is not critical. The solvent is preferably selected from the group consising of aliphatic ketones, aliphatic esters, alkylene glycol monoalkyl ethers, dialkylene glycol monoalkyl ethers, alkylene glycol dialkyl ethers, and mixtures thereof. A particularly preferred class of aliphatic esters are the aliphatic alkylene glycol alkyl ethyl esters. More preferably, the solvent is selected from the group consisting of cyclohexanone, methylcellosolve acetate, ethylcellosolve acetate, butyl acetate, xylene and mixtures thereof. A particularly preferred solvent is a mixture of ethylcellosolve acetate, butylacetate and xylene. The choice of solvent will depend on the specific solid ingredients employed.

After the solid ingredients as described hereinabove have been added to the solvent, the mixture is agitated until all solids are dissolved. The resultant resist solution is microfiltered, preferably using a Millipore microfiltration system under about 30 pounds per square inch of pressure of nitrogen or other inert, oxygen-free, ambient atmosphere.

Additives such as anti-striation agents, plasticizers, adhesion promoters, speed enhancers, and non-ionic surfactants may be added to the solution before it is filtered.

Anti-striation agents may be used up to about a 5% weight level, based on the total weight of the resist composition.

Plasticizers which may be used include, for example, phosphoric acid tri-(B-chloroethyl)-ester; stearic acid; dicamphor; acetal resins; phenoxy resins; and alkyd resins at about 1% to about 5% weight levels, based on the total weight of the novolak resin. The plasticizers improve the coating properties of the material and enable the application to the substrate of a film that is smooth and of uniform thickness.

Adhesion promoters which may be used include, for example, B-(3,4-epoxy-cyclohexyl)-ethyltrimethoxysilane; p-methyl-disilane-methyl methacrylate; vinyltrichlorosilane: and γ-amino-propyl triethyoxysilane up to about a 5% weight level, based on the total weight of the resist composition.

Speed enhancers that may be used include, for example, picric acid, nicotinic acid or nitrocinnamic acid at a weight level of up to about 5%, based on the weight of the total solids in the resist composition. These enhancers tend to increase the solubility of the resist coating in both the exposed and unexposed areas, and thus they are used in applications where speed of development is the overriding consideration even though some degree of contrast may be sacrificed. Thus, while the exposed areas of the resist coating will be dissolved more quickly by the developer, the speed enhancers will also cause a larger loss of resist coating from the unexposed areas.

Non-ionic surfactants that may be used include, for example, nonylphenoxy polyethyleneoxy) ethanol; octylphenoxy (ethyleneoxy) ethanol; and dinonylphenoxy poly(ethyleneoxy) ethanol at up to about 0.5% weight levels, based on the total weight of the resist composition.

The filtered resist composition can be applied to a suitable substrate or support by any conventional method used in the resist art, including dipping, spraying, whirling and spin coating. When spin coating is employed, the percent total solids content is selected to provide coatings of the desired thickness given the type of spinning equipment utilized and the spin speed and the amount of time allowed for the spinning process.

The resist coatings produced by the above-described procedure are particularly suitable for application to thermally grown silicon/silicon dioxide-coated wafers, such as are utilized in the production of microprocessors and other miniaturized integrated circuit components, aluminum/aluminum oxide wafers, galium/arsenside wafers and other wafers typically employed in the art.

After the resist composition is coated onto the substrate, the substrate is baked at about 80° to about 110° C. until substantially all the solvent has evaporated and only a thin coating of the resist, on the order of about one-half to about 3 microns in thickness, remains on the substrate. Typically, the substrate is baked for up to about 20 to about 45 minutes. Preferably, the substrate is baked at about 100° C. for about 30 minutes.

The coated substrate is then imagewise-exposed to radiation in the near (about 450 to about 330 nm) to mid (about 330 to about 280 nm) ultra violet ranges of the spectrum, preferably the near ultra violet region, in any desired exposure pattern produced by use of suitable masks, stencils, templates, or the like. The resists can be exposed using commercially available equipment, for example, a Perkin-Elmer 1:1 Projection Micralign 340 Model.

The exposed, resist-coated substrates are then contacted with an aqueous alkaline developer, preferably by immersion in the developing solution in, for example, a Teflon tank until all of the resist coating has been dissolved from the imagewise-exposed areas. The solution is preferably agitated, for example, by nitrogen burst agitation.

The developer formulation is not critical and typical of the developers useful with the resists of the present invention is "HPRD-419", an aqueous alkaline positive resist developer manufactured by Philip A. Hunt Chemical Corporation. Typical development conditions are 23°±2° C., with the development largely on the exposure energy, developer strength and the developer mode such as spray, puddle, nitrogen burst submersion or mechanical agitation, and pre-bake temperature and time. For example, under mild (magnetic bar) agitation, using "HPRD-419" developer in the immersion mode, the developing time is typically 60 seconds for 2–3 micron coatings pre-baked at about 100° C. for 30 minutes.

After removal of the coated wafers from the developing solution, the wafers are typically rinsed for about one minute with deionized water, and then a post-development heat treatment or bake is employed. The postbaking can be effected by oven baking of the coating and substrate. Typically, the coating is baked at a temperature ranging from about 80° to about 130° C. for about 10 to about 45 minutes, preferably from about 110° to about 130° C. for about 15 to about 45 minutes, and more preferably at about 120° C. for about 40 minutes.

In industrial applications, particularly in the manufacture of microcircuitry units on silicon/silicon dioxidetype substrates, the developed substrates are typically treated with a buffered, hydrofluoric acid-based etching solution. The resists of the present invention are resistant to acid-based etching solutions and provide effective protection for the resist-coated areas of the substrate.

The following examples are provided to illustrate the invention. All parts and percentages are by weight unless otherwise noted.

EXAMPLES 1-9 AND COMPARATIVE EXAMPLES 1-3

The following procedure was followed in each of the Examples and Comparative Examples.

The resist composition was applied to 3-inch diameter oxidized silicon wafers by spin coating at 5000 rpm for 30 seconds on a Headway spinner to provide a film thickness of about 2½ microns in Examples 1-9 or 2 microns in Comparative Examples 1-3. The coated wafers were then prebaked at 80°, 90° or 100° C. for 30 minutes in a convection oven. The prebaked wafers were exposed through a Focus Wedge mask using suitable light filters (Eastman Kodak WRATTEN) on a Perkin Elmer Micralign 340 (1.0 mm slit width, aperture #1). The exposed wafers were developed for about 60 seconds by immersion utilizing an aqueous alkaline developing solution as listed below:

| Component | Amount (% by weight) |
|---|---|
| Deionized water | 94.61 |
| Trisodium phosphate.12 H$_2$O | 2.30 |
| Sodium metasilicate.5 H$_2$O | 1.61 |
| Versene Na (Disodium EDTA.2 H$_2$O) | 0.095 |
| Deionized water adjustment | 1.39 |
| | 100.00 |

A rate of development was then calculated for each Example and Comparative Example in accordance with the following formula:

$$D_R = \frac{PBFT - ADFT}{D_T}$$

where:
 $D_R$=Rate of development
 PBFT=Prebaked film thickness
 ADFT=After developed film thickness
 $D_T$=Time of development The PBFT and the ADFT values were obtained by employing a NANOSPEC AFT Film Thickness Analyzer, (Index of Refraction: 1.68), commercially available from Nanometrics Inc., Sunnyvale, Calif.

The resulting rates of development are reported in Table I below. The results clearly show the marked improvement in rate of development which is achieved when the select additive is present in the resist composition in accordance with the present invention. As the proportion of dye in the resist composition is increased, the rate of development for a given amount of additive tends to decrease. However, even at a level of 2.56 percent of dye in the resist composition, the rates of development were considerably greater as compared to those obtained by using the resist composition of the control.

TABLE I

| Example or Comparative Example (CE) | Resist Composition (% by Weight[1]) | | | | | | Temperature of Prebaking (°C.) | Rate of Development |
|---|---|---|---|---|---|---|---|---|
| | Novolak Resin[2] | Sensitizer[3] | Dye A[4] | B[5] | Additive[6] | Total Solids[7], % | | |
| CE-1 | 75.38 | 24.62 | — | — | — | 33.00 | 80 | 199 |
| 1 | 67.60 | 19.04 | — | 0.26 | 13.10 | 36.29 | 80 | 950 |
| 2 | 66.90 | 18.84 | 1.30 | — | 12.96 | 36.54 | 80 | 791 |
| 3 | 66.04 | 18.60 | 2.56 | — | 12.80 | 36.84 | 80 | 506 |
| CE-2 | 75.38 | 24.62 | — | — | — | 33.00 | 90 | 197 |
| 4 | 67.60 | 19.04 | — | 0.26 | 13.10 | 36.29 | 90 | 888 |
| 5 | 66.90 | 18.84 | 1.30 | — | 12.96 | 36.54 | 90 | 577 |
| 6 | 66.04 | 18.60 | 2.56 | — | 12.80 | 36.84 | 90 | 351 |
| CE-3 | 75.38 | 24.62 | — | — | — | 33.00 | 100 | 190 |
| 7 | 67.60 | 19.04 | — | 0.26 | 13.10 | 36.29 | 100 | 655 |
| 8 | 66.90 | 18.84 | 1.30 | — | 12.96 | 36.54 | 100 | 467 |
| 9 | 66.04 | 18.60 | 2.56 | — | 12.80 | 36.84 | 100 | 296 |

[1]Based on total solids in the resist composition.
[2]A novolak resin prepared from a 45% meta-cresol, 55% para-cresol mixture and having a softening point of about 120° C.
[3]A sensitizer prepared by reacting 1 mole of 2,3,4-trihydroxybenzophenone with 2 moles of napthoquinone-(1,2)-diazide-5-sulfonyl chloride.
[4]Naphthalazine dye having a maximum absorption of 355 nm.
[5]Azobenzene dye having a maximum absorption of 415 nm.
[6]2,3,4-Trihydroxybenzophenone.
[7]The solvent employed in the Examples and Comparative Examples was a mixture of 85% ethylcellosolve acetate, 8.5% butyl acetate and 6.5% xylene.

EXAMPLES 10-18 AND COMPARATIVE EXAMPLES 4-6

Examples 1-9 and Comparative Examples 1-3, respectively, were repeated, except that the developer employed was "HPRD-402", a tetramethyl ammonium hydroxide-containing developer commercially available from Philip A. Hunt Chemical Corporation.

The resulting rates of development are reported in Table II below. The results clearly show the marked improvement in rate of development which is achieved when the select additive is present in the resist composition in accordance with the present invention. As the proportion of dye in the resist composition is increased, the rate of development for a given amount of additive tends to decrease. However, even at a relatively high level of dye in the resist composition, the rate of development in most cases is considerably greater than that obtained by using the resist of the control.

TABLE II

| Example or Comparative Example (CE) | Resist Composition (% by Weight[1]) | | | | | Total Solids[7], % | Temperature of Prebaking (°C.) | Rate of Development |
|---|---|---|---|---|---|---|---|---|
| | Novolak Resin[2] | Sensi-tizer[3] | Dye A[4] | Dye B[5] | Addi-tive[6] | | | |
| CE-4 | 75.38 | 24.62 | — | — | — | 33.00 | 80 | 795 |
| 10 | 67.60 | 19.04 | — | 0.26 | 13.10 | 36.29 | 80 | 1037 |
| 11 | 66.90 | 18.84 | 1.30 | — | 12.96 | 36.54 | 80 | 840 |
| 12 | 66.04 | 18.60 | 2.56 | — | 12.80 | 36.84 | 80 | 533 |
| CE-5 | 75.38 | 24.62 | — | — | — | 33.00 | 90 | 711 |
| 13 | 67.60 | 19.04 | — | 0.26 | 13.10 | 36.29 | 90 | 1050 |
| 14 | 66.90 | 18.84 | 1.30 | — | 12.96 | 36.54 | 90 | 666 |
| 15 | 66.04 | 18.60 | 2.56 | — | 12.80 | 36.84 | 90 | 403 |
| CE-6 | 75.38 | 24.62 | — | — | — | 33.00 | 100 | 629 |
| 16 | 67.60 | 19.04 | — | 0.26 | 13.10 | 36.29 | 100 | 947 |
| 17 | 66.90 | 18.84 | 1.30 | — | 12.96 | 36.54 | 100 | 670 |
| 18 | 66.04 | 18.60 | 2.56 | — | 12.80 | 36.84 | 100 | 415 |

[1]Based on total solids in the resist composition.
[2]A novolak resin prepared from a 45% meta-cresol, 55% para-cresol mixture and having a softening point of about 120° C.
[3]A sensitizer prepared by reacting 1 mole of 2,3,4-trihydroxybenzophenone with 2 moles of naphthoquinone-(1,2)-diazide-5-sulfonyl chloride.
[4]Naphthalazine dye having a maximum absorption of 355 nm.
[5]Azobenzene dye having a maximum absorption of 415 nm.
[6]2,3,4-Trihydroxybenzophenone.
[7]The solvent employed in the Examples and Comparative Examples was a mixture of 85% ethylcellosolve acetate, 8.5% butyl acetate and 6.5% xylene.

EXAMPLES 19 and 20 AND COMPARATIVE EXAMPLES 7 AND 8

In Comparative Examples 7 and 8, the resist composition was applied to 3-inch diameter oxidized silicon wafers by spin coating at 6000 rpm for 30 seconds on a Headway Spinner to provide a film thickness of about 2 microns. The coated wafers were then prebaked at 100° C. for 6 minutes in a track convection oven. The prebaked wafers were exposed through a Focus Wedge mask in a Perkin Elmer Micralign 340 (1.0 mm slit width, aperture #1). The exposed wafers were developed for about 60 seconds by immersion utilizing the aqueous alkaline developing solution as listed in Examples 1-9. The developed wafers were postbaked at about 120° C. for 30 minutes in a convection oven.

In Examples 19 and 20, the same procedure was followed, except as follows: In Examples 19 and 20, the resist composition was applied to the oxidized silicon wafer by spin coating at 5500 rpm to provide a film thickness of about 2 microns.

The data reported in Table III shows the exposure energy required to solubilize the exposed areas of the resist coating during development at a multiple exposure energies to essentially completely remove those resist areas upon subsequent development. The image dimensions were determined using an I.T.P. Videomicrometer System No. 148.

The results show the improvement achieved in photospeed with the resist compositions of the present invention. Considerably less energy was required to obtain the desired image dimension with the resist compositions of the present invention.

TABLE III

| Example or Comparative Example (CE) | Resist Composition (% by Weight[1]) | | | | | Total Solids[7], % | PBFT[8] | FTL[9] | Exposure Energy (mJ/cm²) | D.I.D.[10] (micron) |
|---|---|---|---|---|---|---|---|---|---|---|
| | Novolak Resin[2] | Sensi-tizer[3] | Dye A[4] | Dye B[5] | Additive[6] | | | | | |
| CE-7 | 75.38 | 24.62 | — | — | — | 33.00 | 18682 | −69 | 210 | 2.75 |
| CE-8 | 74.81 | 24.43 | 0.76 | — | — | 33.17 | 18742 | +264 | 270 | 3.00 |
| 19 | 65.03 | 21.24 | 0.66 | — | 13.07 | 36.34 | 18695 | −2001 | 40 | 3.12 |
| 20 | 65.03 | 21.24 | — | 0.66 | 13.07 | 36.34 | 18154 | −716 | 128 | 2.99 |

[1]Based on total solids in the resist composition.
[2]A novolak resin prepared from a 45% meta-cresol, 55% para-cresol mixture and having a softening point of about 120° C.
[3]A sensitizer prepared by reacting 1 mole of 2,3,4-trihydroxybenzophenone with 2 moles of naphthoquinone-(1,2)-diazide-5-sulfonyl chloride.
[4]Coumarin 504 dye having a maximum absorption of 435 nm.
[5]Naphthalazine dye having a maximum absorption of 355 nm.
[6]2,3,4-Trihydroxybenzophenone.
[7]The solvent employed in the Examples and Comparative Examples was a mixture of 85% ethylcellosolve acetate, 8.5% butyl acetate and 6.5% xylene.
[8]PBFT denotes prebaked film thickness (in Angstroms).
[9]FLT denotes film thickness loss (in Angstroms).
[10]D.I.D. denotes developed image dimension; nominal of a window of 3 microns.

What is claimed is:
1. A method of forming a resist pattern on a substrate comprising:
   coating said substrate with a layer of a positive-working photoresist composition;
   exposing said layer patternwise to actinic radiation; and
   removing the exposed portions of said layer with an aqueous alkaline developer for the exposed resist composition to uncover the areas of the substrate beneath the exposed portions; said positive-working photoresist composition comprising a solvent and solid ingredients dissolved therein; said solids, whose proportions are based by weight on the total solids in said composition, comprise:
   (a) from about 63 to about 68 percent of a novolak resin;
   (b) from about 15 to about 22 percent of a naphthoquinone diazide sensitizer prepared by mono-, di- or tri-esterifying a low molecular weight phenol compound with 1,2-naphthoquinone-2-diazide-5-chloride, said phenol compound having the formula

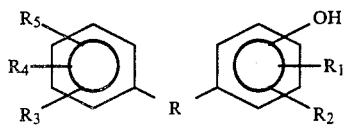

wherein:

R is a single bond or one of the groups CO, S, O, SO$_2$ or CR$_6$R$_7$;

R$_1$, R$_2$, R$_3$, R$_4$ and R$_5$ are each independently H, X (where X is a halogen atom), OH, a lower alkyl group having 1 to 4 carbon atoms or a lower alkoxy group having 1 to 4 carbon atoms; and R$_6$ and R$_7$ are each independently H or a lower alkyl group having 1 to 4 carbon atoms; or wherein:

two of the radicals R$_3$, R$_4$ and R$_5$ or the two radicals R$_1$ and R$_2$ independently jointly form an aromatic ring, whereby at least one of the radicals R$_1$, R$_2$, R$_3$, R$_4$ or R$_5$ is OH;

(c) from about 0.1 to about 3 percent of a dye a which absorbs light at a maximum wavelength of from about 330 to about 460 nm; and (d) an effective proportion of an additive compound to increase the photospeed and rate of development of said composition, said additive compound being a trihydroxybenzophenone compound and said proportion ranging from about 10 to about 20 percent.

2. The method of claim 1, wherein said additive compound is 2,3,4-trihydroxybenzophenone.

3. The method of claim 1, wherein said novolak resin is a cresol-formaldehyde novolak resin produced by condensing a mixture of cresol isomers with formaldehyde in the presence of acid, said mixture including from about 45 to about 60 percent of meta-cresol and from about 55 to about 40 percent of para-cresol, by weight.

4. The method of claim 3, wherein said dye absorbs light at a maximum wavelength of from about 400 to about 460 nm.

5. The method of claim 4, wherein said composition comprises:

(a) from about 65 to about 68 percent of said novolak resin;

(b) from about 16 to about 21 percent of said naphthoquinone diazide sensitizer;

(c) from about 0.2 to about 1.5 percent of said dye; and (d) wherein said additive compound is 2,3,4-trihydroxybenzophenone and said proportion ranges from about 10 to about 15 percent.

6. The method of claim 5, wherein said composition comprises:

(a) about 67.60 percent of said novolak resin, said mixture of cresol isomers including about 45 percent of meta-cresol and about 55 percent of para-cresol;

(b) about 19.04 percent of said naphthoquinone diazide sensitizer, wherein said naphthoquinone diazide sensitizer is the esterification product of 1 mole of 2,3,4-trihydroxybenzophenone with 2 moles of naphthoquinone-(1,2)-diazide-5-sulfonyl chloride;

(c) about 0.26 percent of said dye and wherein said dye absorbs light at a maximum wavelength of from about 400 to about 440 nm and is selected from the group consisting of anthraquinones, coumarins, diphenylmethanes, triphenylmethanes, phenazines, oxazines, xanthenes and azo compounds having the formula

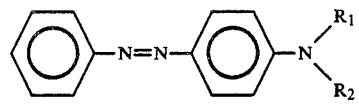

wherein: R$_1$ and R$_2$ are each independently an alkyl group having 1 to 12 carbon atoms and a cycloalkyl group having 5 to 12 carbon atoms; and (d) about 13.10 percent of said 2,3,4-trihydroxybenzophenone.

* * * * *